United States Patent
Foerster et al.

(10) Patent No.: US 8,370,677 B2
(45) Date of Patent: *Feb. 5, 2013

(54) METHOD AND SYSTEM FOR USING LOGICAL VALUES TO REPRESENT SEQUENCE OF OSCILLATION PERIODS OF A MODULATED CLOCK SIGNAL IN TIME SYNCHRONIZED MEASUREMENT SYSTEM

(75) Inventors: Sven Foerster, Muehlenbeck (DE); Steffen Schmack, Berlin (DE); Michael Schuricht, Berlin (DE); Hans-Ulrich Vollmer, Berlin (DE)

(73) Assignee: Tektronix, Inc., Beaverton, OR (US)

( * ) Notice: Subject to any disclaimer, the term of this patent is extended or adjusted under 35 U.S.C. 154(b) by 229 days.

This patent is subject to a terminal disclaimer.

(21) Appl. No.: 12/779,230

(22) Filed: May 13, 2010

(65) Prior Publication Data

US 2010/0223487 A1     Sep. 2, 2010

Related U.S. Application Data

(62) Division of application No. 11/408,867, filed on Apr. 20, 2006, now Pat. No. 7,787,576.

(30) Foreign Application Priority Data

Apr. 29, 2005   (EP) .................................. 05009485

(51) Int. Cl.
*G06F 1/00*    (2006.01)
*G06F 1/04*    (2006.01)
*G06F 1/14*    (2006.01)

(52) U.S. Cl. ....................................... 713/500; 713/502

(58) Field of Classification Search ................... 713/400, 713/502, 500
See application file for complete search history.

(56) References Cited

U.S. PATENT DOCUMENTS

| | | | |
|---|---|---|---|
| 4,104,860 A | 8/1978 | Stickel | |
| 4,494,211 A | 1/1985 | Schwartz | |
| 4,598,575 A | 7/1986 | Wilke | |
| 5,367,524 A | 11/1994 | Rideout et al. | |
| 5,666,330 A | 9/1997 | Zampetti | |
| 5,673,133 A | 9/1997 | Imaoka et al. | |
| 5,794,033 A | 8/1998 | Aldebert et al. | |
| 5,828,899 A | 10/1998 | Richard et al. | |
| 5,859,549 A | 1/1999 | Shuholm | |
| 6,148,038 A | 11/2000 | Drost et al. | |
| 6,188,286 B1 | 2/2001 | Hogl et al. | |
| 6,675,339 B1 | 1/2004 | Lanier et al. | |
| 2002/0001299 A1 | 1/2002 | Petch et al. | |
| 2002/0178292 A1 | 11/2002 | Mushkin et al. | |
| 2004/0001483 A1 | 1/2004 | Schmidt et al. | |
| 2004/0008187 A1 | 1/2004 | Gaksch et al. | |
| 2004/0062278 A1 | 4/2004 | Hadzic et al. | |
| 2004/0196898 A1* | 10/2004 | Underwood | 375/238 |

* cited by examiner

*Primary Examiner* — Thomas Lee
*Assistant Examiner* — Xuxing Chen
(74) *Attorney, Agent, or Firm* — Fogarty, L.L.C.

(57) ABSTRACT

A time synchronized measurement system has a master device and a slave device. The master device and the slave device each have a time measurement device for assigning a corresponding time of sending and/or receiving a piece of measurement information. The master device also has a reference clock pulse-generating device for transmitting a reference clock signal to the slave device. The reference clock signal is modulated by a piece of information on a common time basis for the master device and the slave device.

20 Claims, 4 Drawing Sheets

METHOD AND SYSTEM FOR USING LOGICAL VALUES TO REPRESENT SEQUENCE OF OSCILLATION PERIODS OF A MODULATED CLOCK SIGNAL IN TIME SYNCHRONIZED MEASUREMENT SYSTEM

The present application is a divisional of co-pending U.S. patent application Ser. No. 11/408,867, filed Apr. 20, 2006, and entitled "Time Synchronization of Master and Slave Devices," which claims foreign priority under 35 U.S.C. §119 to European Patent Application No. EP 05009485.3, filed Apr. 29, 2005, and entitled "Time-Synchronized Measuring System and Method of Synchronizing at Least One Master/Slave Device," the disclosures of which are hereby incorporated by reference herein in their entirety.

BACKGROUND OF THE INVENTION

The present invention relates to a time synchronized measurement system, and more particularly to a system for time synchronizing a master device and a slave device. In the field of protocol measurement, protocol testers and monitoring apparatuses are used which send and receive protocol messages or only receive protocol messages. In order to be able to draw desired conclusions with regard to problems occurring during transmission, the protocol messages are given a time stamp when sent and received, and are stored. In this process different switching units may be responsible for different protocol messages so that with respect to the time stamp there are no problems when the different switching units are different measurement cards of a protocol tester or monitoring apparatus. A time basis, such as a test time or absolute time, may be defined within the protocol tester or monitoring apparatus. The test time forms a common time basis for all measurement cards of the device, i.e., the time stamps generated by the different measurement cards may be placed in relation to each other because they all refer to the same time basis. A problem arises when the corresponding measurement cards are implemented in different apparatuses, i.e., different protocol testers or monitoring apparatuses. Now the different protocol testers or monitoring apparatuses need to be synchronized with respect to a common time basis.

One protocol tester or monitoring apparatus acts as a master device and another protocol tester or monitoring apparatus acts as a slave device. The master device is equipped with a reference clock pulse-generating device and provides to the slave device a reference clock signal via a separate line. Both the master device and the slave device are equipped with a time measurement device, and the time measurement devices are synchronized with respect to the reference clock signal. While this makes the two time measurement devices run synchronously, the problem remains of setting the two time measurement devices to the common time basis, i.e., to a common test time or absolute time. Usually the master device and the slave device are connected via a communication network, such as an Ethernet network. A time server may be connected to the Ethernet network so that the master device and the slave device query information on the common time basis from the time server. What is problematic about this is that Information on the common time basis is related to a specific, previously agreed signal that emanates from the time server. When the agreed signal arrives at the master device or the slave device depends on the distance between the relevant devices and the time server and on the capacity, i.e., the traffic volume, on the network. For example, if a 10 MHz rectangular signal is used as the reference clock signal, then a resolution of 100 ns may be achieved. However because of the aforementioned effects, deviations in the ms range may already result between the time measurement devices of the master and slave devices relative to each other.

Another known procedure envisages equipping both the master device and the slave device with a GPS (Global Positioning System) receiver and synchronizing them for setting the common time basis with respect to the time information, i.e., UTC (Coordinated Universal Time), emitted with the GPS signal. However this procedure is expensive and does not take into consideration that in many environments there is no access to a GPS antenna.

What is desired is to develop a method for low-cost and reliable synchronization of a master device and a slave device with respect to a common time basis.

BRIEF SUMMARY OF THE INVENTION

Accordingly the present invention provides for the transmission of a reference clock signal from a master device to a slave device that also transmits information about a common time basis. The reference clock signal is modulated with information about the common time basis. The transmission is independent of traffic volume on the network via which the master device and the slave device are connected. The propagation time between the master device and the slave device is therefore essentially a constant and may be taken into consideration for long distances between the master device and the slave device. The line that exists for the transmission of the reference clock signal from the master device to the slave device is therefore used in an optimum way for a dual purpose. Modulation methods may include amplitude modulation, pulse width modulation or encoding methods of the kind used for digital data transmission, such as NRZ (non-return to zero), Manchester code and the like. Alternatively, the reference clock signal and information about the common time basis may be transmitted by multitasking, which also comes under the term "modulation". As an example, a simple pulse width modulation may transmit most of the time a certain pattern, which corresponds to a logic "0". The pattern is interrupted periodically, such as every second, by an information block relating to the common time basis. The information block preferably has of a start pattern that indicates that the information block itself is now being transmitted, followed by the information block itself. In order for the time measurement device of the slave device to be set to the common time basis, the relationship between the piece of information relating to the common time basis and the modulated signal must be known. The common time basis may relate to the start of the information block itself. Another option is to relate the common time basis to a known bit position within the information block itself (for example the $64^{th}$ bit or the last bit). Another option is to relate the common time basis to the start or to a known bit position within the next information block.

The objects, advantages and other novel features of the present invention are apparent from the following detailed description when read in conjunction with the appended claims and attached drawing.

It may be envisaged to transmit, by modulation of the reference clock signal, further, particularly time-critical, pieces of information from the master device to the slave device. Moreover, a checksum can be added to the information block.

As already mentioned, in a preferred embodiment of the time-synchronised measurement system according to the present invention, the master device is a master communication device, the slave device is a slave communication device and the measurement information is a protocol message in a telecommunication network.

The common time basis may be the absolute time, e.g. in terms of year, month, day, hour, minutes, seconds etc., whereby it can be UTC, CET or, for example, the Julian date. The common time basis can, however, also be a system time, particularly a test time, which starts to run at the beginning of a test. In a simple embodiment, two 32-bit values can be used for this purpose, one of which counts the seconds while the other counts the decimal places of the seconds.

The reference clock signal is preferably transmitted DC-free, and the modulation is such that the modulated reference clock signal, too, can be transmitted DC-free, even if the reference clock signal in the master device and/or in the slave device exhibits a DC component. This provides the opportunity to use inductivities and/or capacitors for the coupling.

The modulation can consist in that a signal agreed between the master device and the slave device defines the start of a system time. If a certain bit pattern is continuously transmitted, e.g. a bit pattern defining a logic "0", then the first-time transmission of another bit pattern, e.g. a bit pattern defining a logic "1", can determine the start of the system time. For this approach the modulation requirements are minimal.

The modulation can, however, also consist in that the current time, related to the common time basis, especially the absolute time, is transmitted, with reference to a signal agreed between the master device and the slave device, in an encoded format, e.g. in the information block itself already mentioned above.

Particularly for a distance between a master device and a slave device, which is so long that the propagation time of the modulated reference clock signal from the master device to the slave device should be taken into account with regard to the accuracy, there may be envisaged a propagation time determination device that determines the propagation time of the reference clock signal between the master device and the slave device and takes said propagation time into account for the modulation of the reference clock signal. Preferably, the propagation time determination device comprises, apart from the line on which the reference clock signal is transmitted, another line on which a signal can be transmitted from the slave device to the master device. By measuring the propagation time via the line out and the line back and halving this measured value, it is possible to determine a good approximation to the propagation time.

If two measurement systems each having a master device are to be synchronised to each other, which are so far apart that it is difficult to provide a line for the transmission of a modulated reference clock signal, it may still be possible to set up a common time basis, whereby every master device comprises a reference clock pulse-generating device each, a time measurement device each, which, initially, are not synchronised with each other, and a GPS receiver each, whereby each GPS receiver is designed to make available a pulse signal, particularly with one pulse per second, to the corresponding reference clock pulse-generating device for the purpose of synchronisation, and to receive an absolute time signal and to make said absolute time signal available to the corresponding time measurement device for setting the corresponding time measurement device. This way, other master devices and the respective slave devices connected thereto can be synchronised with each other.

In a preferred embodiment, the reference clock signal is 10 MHz. Said reference clock signal may, in particular, be a rectangular signal.

Moreover, for an preferred embodiment, it is envisaged that in the modulated reference clock signal, a logic "0" is defined by one period of the reference clock signal with a 75/25 duty cycle and one period of the reference clock signals with a 25/75 duty cycle (or by a double sequence of said signals), and a logic "1" is defined by two periods of the reference clock signal with a 75/25 duty cycle and two periods of the reference clock signal with a 25/75 duty cycle and, furthermore, by two periods of the reference clock signal with a 25/75 duty cycle and two periods of the reference clock signal with a 75/25 duty cycle. The agreement of two different patters for a "1" provides the possibility of starting the information block for each clock pulse period of the reference clock signal. For a given reference clock signal, this results in an accuracy that is twice as high, because for the example of a 10 MHz reference clock signal, no block corresponding to a "0" or a "1", has to be completed by two or four clock pulse periods, but instead it is possible to already change to a "1" after a clock pulse period of a "0". Depending on which bit pattern of the "0" is available at the time of the desired changeover to a "1", i.e. a clock cycle with a 75/25 duty cycle or a clock cycle with 25/75 duty cycle, there is a skip to another "1" signal. As a consequence, there results a symmetric generator state machine. Preferably, there are several slave devices in a time-synchronised measurement system, whereby each slave device exhibits an output, at which it can make the modulated reference clock signal available to another slave device. This allows a so-called daisy chain to be set up.

The preferred embodiments presented above in connection with the time-synchronised measurement system according to the present invention apply accordingly to the method according to the present invention.

DETAILED DESCRIPTION OF THE INVENTION

Figure 1:
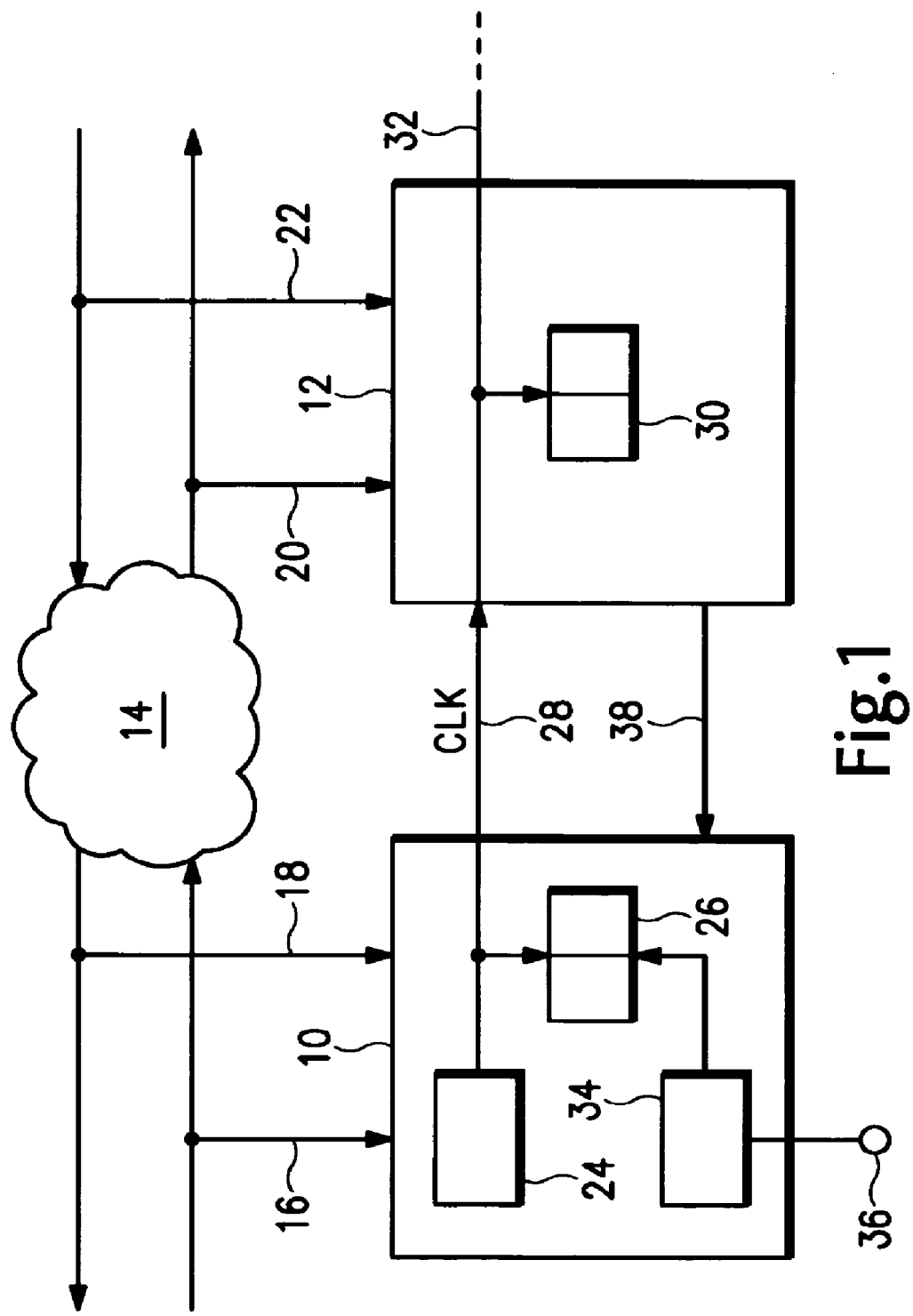
FIG. 1 is schematic diagram view of an embodiment of a measurement system according to the present invention.

Referring now to FIG. 1, an embodiment of a measurement system according to the present invention is shown in which a master device 10 and a slave device 12 are connected to a communication network 14. The master device 10 receives information, particularly measurement information, from the communication network 14 via a first line 16 and a second line 18, and the slave device 12 receives information, particularly measurement information, from the communication network 14 via third and fourth lines 20 and 22. The master device 10 includes a reference clock pulse-generating device 24 that provides a reference clock signal, Clk, to a time measurement device 26, such as a clock, mounted inside the master device. The reference clock signal, Clk, is transmitted from the master device 10, preferably DC-free, via a clock line 28 to the slave device 12. In the slave device 12 the reference clock signal is input to a time measurement device 30. The reference clock signal is provided at an output of the slave device 12 for further slave devices in a daisy chain. The master device 10 has a device for starting a test time or for setting an absolute time. The test time may start to run automatically when a test run is started by the master device 10. In a simple embodiment two 32-bit values may be used for the test time, one for counting seconds and the other for counting the decimal places of the seconds. Alternatively, the master device 10 may have a GPS receiver 34 that is connected to a GPS antenna via a port 36. The GPS receiver 34 receives a 1 pps (pulse per second) signal and an absolute time signal. The absolute time may be in terms of year, month, day, hour, minutes, seconds, etc., such as UTC, CET or Julian date. In the master device 10 the 1 pps signal is used to synchronize the reference clock pulse-generating device 24. The absolute time signal is used to set the absolute time on the time measurement device 26. Alternatively the master device 10 may receive via the first or second line 16, 18 a signal about a common time basis, such as from a time server, and use it for setting the time measurement device 26.

The time measurement device 26 of the master device 10 and the time measurement device 30 of the slave device 12 are synchronized with each other via the clock line 28. The reference clock signal transmitted via the clock line 28 is modulated, as described below, by an information block having an agreed upon location within the block for the common time basis of the master device and the slave device. The modulated reference clock signal is then used for setting the time measurement device 30 of the slave device 12. The modulated reference clock signal also preferably is DC-free so that inductors and capacitors may be used for coupling.

To determine the propagation time of a signal between the master device 10 and the slave device 12, a signal is sent from the master device 10 via the clock line 28 to the slave device. The signal is then sent from the slave device 12 via a return line 38 back to the master device 10. From the difference between the sending of the signal from the master device 10 and the receipt of the same signal by the master device, there is determined by taking account of known processing times the propagation time, which is taken into account for the modulation of the reference clock signal, i.e., for compensation.

Figure 2:
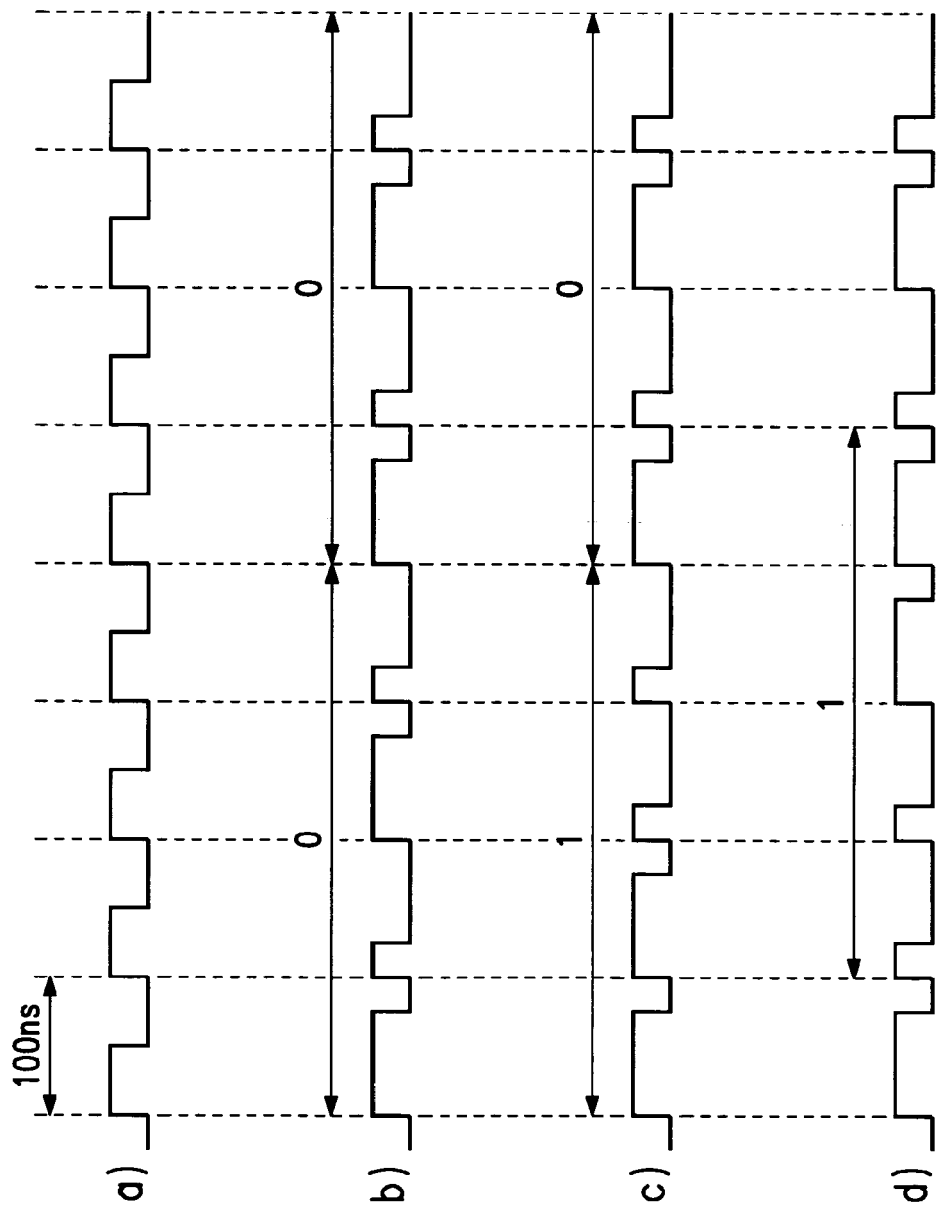
FIG. 2 is a timing view for an embodiment of modulation of a reference clock signal according to the present invention.

FIG. 2 shows the shape of the reference clock signal (a) over time, which in the present example has a period of 100 ns corresponding to a frequency of 10 MHz. A modulated reference clock signal (b) has a previously agreed "0" continuously sent. In the present example a logic "0" is defined by four periods of oscillation where the third and fourth period of oscillation are identical to the first and second period of oscillation. The first period of oscillation shows a duty cycle of 75/25 and the second period of oscillation a duty cycle of 25/75. Another modulated reference signal (c) has a first variant of a logic "1" that is defined by four periods of oscillation, where the first and second periods of oscillation show a duty cycle of 75/25 and the third and fourth periods of oscillation show a duty cycle of 25/75. A further modulated reference signal (d) has a second variant of a logic "1" where the logic "1" again has four periods of oscillation, the first and second periods of oscillation showing a duty cycle of 25/75 and the third and fourth periods of oscillation showing a duty cycle of 75/25.

Figure 3:
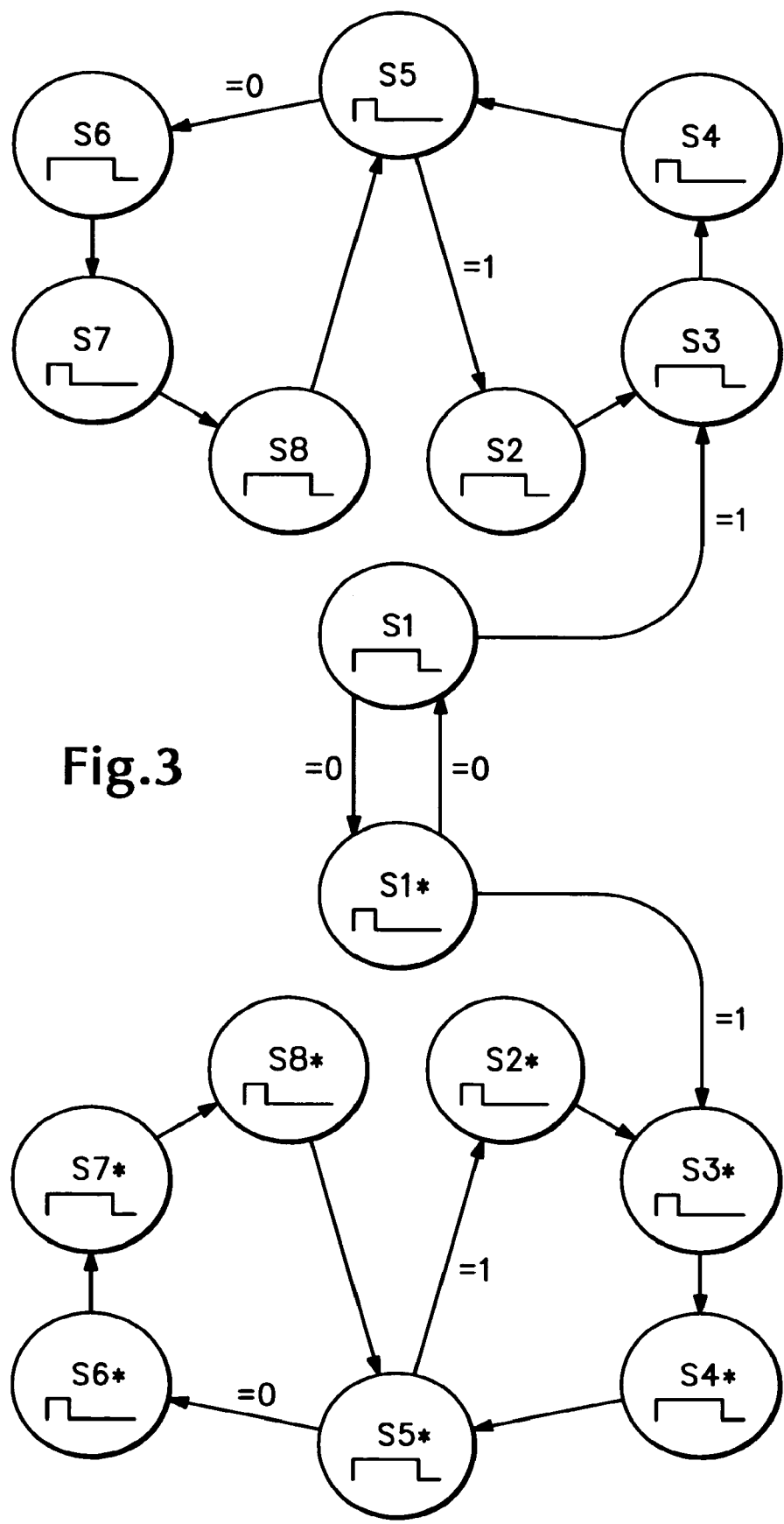
FIG. 3 is a state diagram view for modulating the reference clock signal as shown in FIG. 2.

An associated generator state machine is shown in FIG. 3 for switching from a 0 to a 1 with a resolution of one period of oscillation. Referring to the first modulated reference signal (b) the signal to switch to a logic "1" appears within the first period of oscillation, a changeover is made to the first variant of the logic "1" (c), i.e., after the first period of oscillation of the "0" a renewed period of oscillation having a 75/25 duty cycle points to a transition to a logic "1". If the signal to change over to a logic "1" is initiated within the second period of the logic "0", a changeover is made to the second variant of the logic "1" (d), i.e., the "1" starts with a duty cycle of 25/75.

Using the two different variants of a logic "1", it is therefore possible to achieve a resolution of 100 ns for a 10 MHz signal. If only a single variant of a logic "1" were provided, a changeover could only be made after the second or the fourth period of oscillation of the logic "0", i.e., the resolution would only be 200 ns.

The modulation is an agreed upon signal that defines the start of a system time. If a certain bit pattern is continuously transmitted, i.e., a bit pattern defining a logic "0", then the first-time transmission of another bit pattern, i.e., a bit pattern defining a logic "1", may determine the start of the system time. This particular scheme has minimal modulation requirements. However the modulation may be in an encoded format so that the agreed upon signal is within a block of information.

Figure 4:
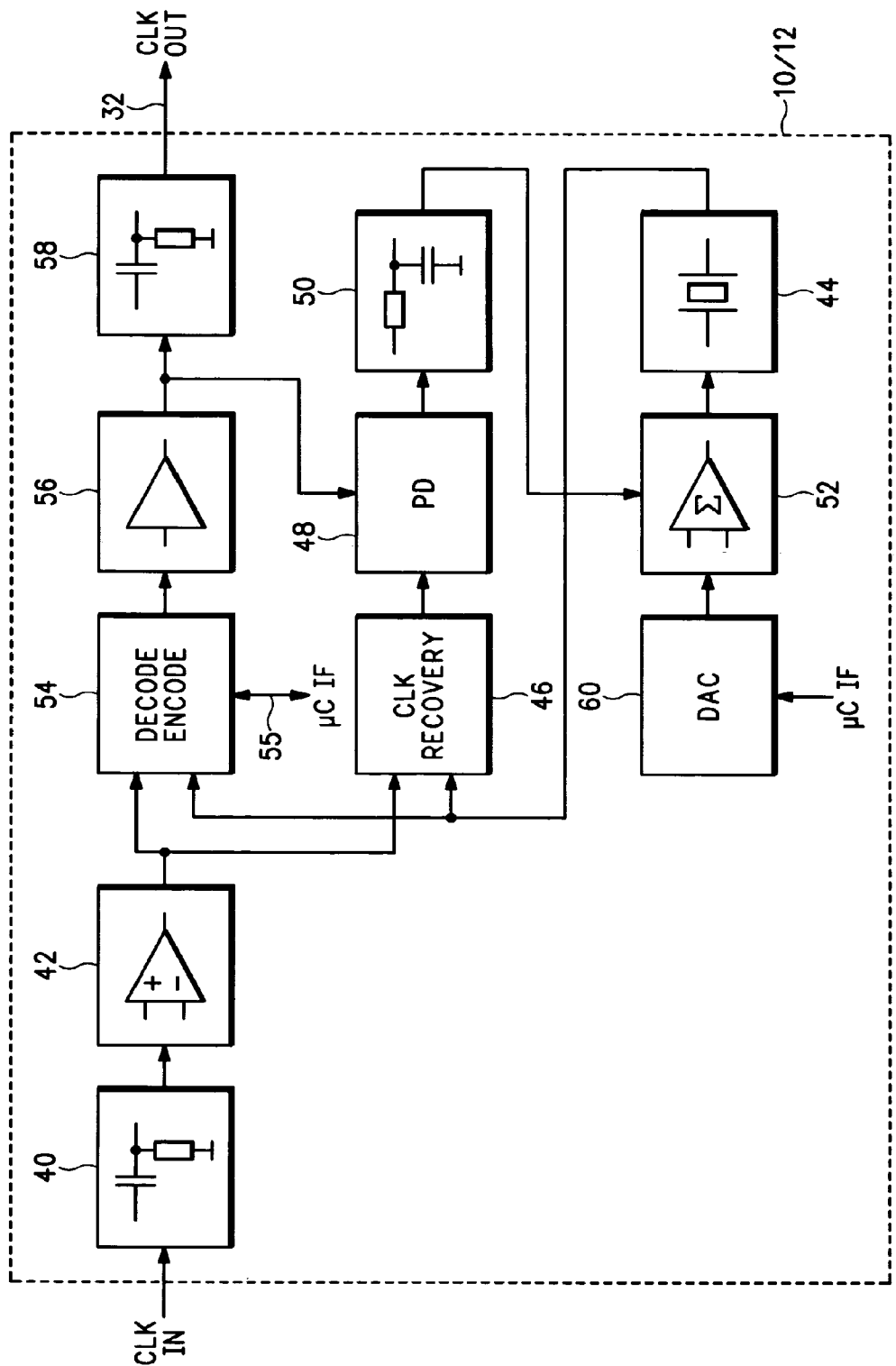
FIG. 4 is a block diagram view of an embodiment of a master/slave device according to the present invention.

FIG. 4 shows a more detailed view of an embodiment of a device that may be used as a master device 10 or as a slave device 12 at the same time. The master and slave devices 10, 12 are set up identically, so that each slave device may take over functions of the master device. If the device 10, 12 has a reference clock signal, Clk, sent to it, it synchronizes an internal oscillator 44 to the reference clock signal sent, and sets the time measurement device to the information on the common time basis transmitted with the reference clock signal. If the device 10, 12 is not sent a reference clock signal, the clock pulse of the internal oscillator 44 serves for the synchronization of the additional devices connected at the output 32. The information on the common time basis is received via an interface 55 from a time server, a GPS receiver, or from a test apparatus in which the device 10, 12 is installed.

The device 10, 12 receives at its input the modulated reference clock signal, which first runs through an optional filter 40 to separate any DC components that may have been added within the device to the modulated reference clock signal which is transmitted DC-free. In an amplifier 42 the original rectangular shape is regained for the reference clock signal, which may have been rounded as a result of transmission length. The device 10, 12 has an oscillator 44 that is to be synchronized to the reference clock signal. After the amplifier 42 the reference clock signal is input to a clock recovery circuit 46 for the restoration of the 10 MHz clock pulse. The recovered clock is then input to a phase discriminator 48, a low pass filter 50 and an adder 52 in sequence before it is coupled to the oscillator 44.

If the device 10, 12 serves as a master device, the information on the common time basis is provided via an interface 55 to a decode/encode circuit 54 for modulating the reference clock signal ("Encode"). The modulated reference clock signal is amplified in an amplifier 56 and made available via an output filter 58 that serves to separate direct current to the output 32. If device 10, 12 serves as a slave device, the information on the common time basis is recovered ("Decode") in the decode/encode circuit 54 from the modulated reference clock signal provided at its input and made available via interface 55 to the internal time measurement device 30, as shown in FIG. 1. An optional digital to analog converter (DAC) 60 serves to control the frequency of the reference clock signal during the master operation of the device 10, 12.

A plurality of the devices 10, 12 may be connected with each other in the form of a daisy chain. The first device 10, 12 in the chain acts as the master device and makes available at its output 32 the modulated reference clock signal. The following devices 10, 12 in the chain act as slave devices and use the modulated reference clock signal for synchronizing their internal oscillators and setting their internal time measurement devices to the common time basis. Each slave device 12 in the chain makes available at its output 32 the modulated reference clock signal for further slave devices.

What is claimed is:

1. A system, comprising:
a clock circuit configured to produce a clock signal; and
an encoder circuit coupled to the clock circuit, the encoder circuit configured to modulate the clock signal with common time basis information to produce a modulated clock signal, the modulated clock signal comprising:
a first logic value having: a first period followed by a second period, the second period followed by a third period, and the third period followed by a fourth period, wherein the first and third periods each have a first duty cycle, and the second and fourth periods each have a second duty cycle that is complementary to the first duty cycle; and
a second logic value having: a fifth period followed by a sixth period, a seventh period following the sixth period, and an eight period following the seventh period, wherein: (a) the fifth and sixth periods each have the first duty cycle and the seventh and eight periods each have the second duty cycle, or (b) the fifth and sixth periods each have the second duty cycle and the seventh and eight periods each have the first duty cycle.

2. The system of claim 1, wherein the system includes a master device in a telecommunications network, the system further comprising:
a transmitter circuit configured to transmit the modulated clock signal to a slave device in the communications network, the slave device being configured to recover the time basis information from the modulated clock signal.

3. The system of claim 2, wherein the common time basis information comprises an absolute time usable as a common time basis between the master device and the slave device.

4. The system of claim 2, wherein the common time basis information comprises a test time usable as a common time basis between the master device and the slave device.

5. The system of claim 2, wherein the encoder circuit is further configured to compensate for a propagation time between the master device and the slave device in modulating the clock signal.

6. The system of claim 1, wherein the-modulated-clock signal comprises a DC-free signal.

7. The system of claim 1, further comprising:
a reference clock pulse-generating device;
a time measurement device; and
a GPS receiver coupled to the reference clock-pulse generating device and to the time measurement device, the GPS receiver configured to receive a pulse signal and to make it available to the reference clock pulse-generating device and to the time measurement device, the reference clock pulse-generating device configured to perform a synchronization operation based on the pulse signal, and the time measurement device configured to perform a time measurement operation based on the pulse signal.

8. The system of claim 1, wherein the clock signal comprises a 10 MHz clock signal, and wherein the encoder circuit is configured to switch the modulated clock signal from the first logic level to the second logic level with a resolution of 100 ns.

9. The system of claim 1, wherein the encoder circuit is configured to switch the modulated clock signal from the first logic level to the second logic level immediately after any of the first, second, third, or fourth periods.

10. The system of claim 1, wherein the first duty cycle is a 25/75 duty cycle and wherein the second duty cycle is a 75/25 duty cycle.

11. The system of claim 1, wherein the first duty cycle is a 75/25 duty cycle and wherein the second duty cycle is a 25/75 duty cycle.

12. A method, comprising:
receiving a clock signal; and
modulating the clock signal with a common time basis to produce a modulated clock signal encoding the common time basis, the common time basis usable by a master and a slave device in a telecommunications network to synchronize one or more operations, the modulated clock signal comprising:
a first logic value having: a first period followed by a second period, the second period followed by a third period, and the third period followed by a fourth period, wherein the first and third periods have a first duty cycle, and the second and fourth periods have a second duty cycle that is complementary to the first duty cycle; and
a second logic value having: a fifth period followed by a sixth period, a seventh period following the sixth period, and an eight period following the seventh period, wherein:
in connection with the modulated clock signal being switched from the first logic level to the second logic level immediately after the first or third periods, the fifth and sixth periods each have the second duty cycle and the seventh and eight periods each have the first duty cycle; and
in connection with the modulated clock signal switching from the first logic level to the second logic level immediately after the second or fourth periods, the fifth and sixth periods each have the first duty cycle and the seventh and eight periods each have the second duty cycle.

13. The method of claim 12, wherein the clock signal has a given frequency f, and wherein the modulated signal is capable of switching from the first logic level to the second logic level with a resolution of 1/f.

14. The method of claim 12, wherein modulating includes switching the modulated signal from the first logic level to the second logic level with a resolution equal to the first, second, third, fourth, fifth, sixth, seventh, and eighth periods.

15. The method of claim 12, wherein the first duty cycle is a 25/75 duty cycle and wherein the second duty cycle is a 75/25 duty cycle.

16. The method of claim 12, wherein the first duty cycle is a 75/25 duty cycle and wherein the second duty cycle is a 25/75 duty cycle.

17. A system, comprising:
a receiver circuit configured to receive a modulated clock signal; and
a decoder circuit coupled to the receiver circuit, the decoder circuit configured to demodulate the modulated clock signal to recover common time basis information encoded in the modulated clock signal, the modulated clock signal comprising:
a first logic value having: a first period followed by a second period, the second period followed by a third period, and the third period followed by a fourth period, wherein the first and third periods each have a first duty cycle, and the second and fourth periods each have a second duty cycle that is complementary to the first duty cycle; and a second logic value having: a fifth period followed by a sixth period, a seventh period following the sixth period, and an eight period following the seventh period, wherein:
  in a first portion of the modulated signal, the fifth and sixth periods each have the first duty cycle and the seventh and eight periods each have the second duty cycle; and
  in a second portion of the modulated signal, the fifth and sixth periods each have the second duty cycle and the seventh and eight periods each have the first duty cycle.

18. The system of claim 17, wherein the system includes a slave device in a telecommunications network, and wherein the modulated clock signal is received from a master device in the telecommunications network.

19. The system of claim 17, wherein the first duty cycle is a 25/75 duty cycle and wherein the second duty cycle is a 75/25 duty cycle.

20. The system of claim 17, wherein the first duty cycle is a 75/25 duty cycle and wherein the second duty cycle is a 25/75 duty cycle.

* * * * *